(12) United States Patent
Gergintschw et al.

(10) Patent No.: US 6,541,999 B2
(45) Date of Patent: Apr. 1, 2003

(54) CIRCUIT CONFIGURATION WITH TEMPERATURE PROTECTION AND METHOD FOR IMPLEMENTING THE TEMPERATURE PROTECTION

(75) Inventors: Zenko Gergintschw, München (DE); Holger Heil, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/078,193

(22) Filed: Feb. 19, 2002

(65) Prior Publication Data
US 2002/0113617 A1 Aug. 22, 2002

(30) Foreign Application Priority Data
Feb. 16, 2001 (DE) .......................................... 101 07 386

(51) Int. Cl.⁷ .............................................. H03K 17/16
(52) U.S. Cl. ........................ 326/32; 327/512; 327/378; 326/82
(58) Field of Search .............................. 326/31, 32, 82; 327/512, 513, 378, 108

(56) References Cited

U.S. PATENT DOCUMENTS

| | | | |
|---|---|---|---|
| 6,366,153 B1 | * | 4/2002 | Arslain et al. ............... 327/512 |
| 6,433,556 B1 | * | 8/2002 | Smith .......................... 324/546 |
| 6,437,610 B1 | * | 8/2002 | Schrodinger ................ 327/108 |
| 2002/0079944 A1 | * | 6/2002 | Sander ........................ 327/309 |

OTHER PUBLICATIONS

Helmuth Lemme: "Sichere Schaltungen mit TOPFET" [safe circuits with TOPFET], Elektronik; No. 4, 1993, pp. 24–27.

* cited by examiner

*Primary Examiner*—Don Le
(74) *Attorney, Agent, or Firm*—Laurence A. Greenberg; Werner H. Stemer; Ralph E. Locher

(57) ABSTRACT

A configuration for protecting an integrated circuit against over-temperature conditions is described. The configuration has at least one detector device, which identifies a disturbance situation of the integrated circuit, at least one temperature sensor, which detects the temperature of at least one part of the integrated circuit, and a logic device. The logic device ascertains a disturbance mode in dependence a detected disturbance situation and/or the detected temperature and which allocates a first temperature switching stage to the temperature sensor in the normal mode and allocates a second, lower temperature switching stage to the temperature sensor in the disturbance mode. Furthermore, the invention relates to an integrated circuit having such a configuration and also to a method for protecting an integrated circuit against over-temperature conditions.

25 Claims, 2 Drawing Sheets

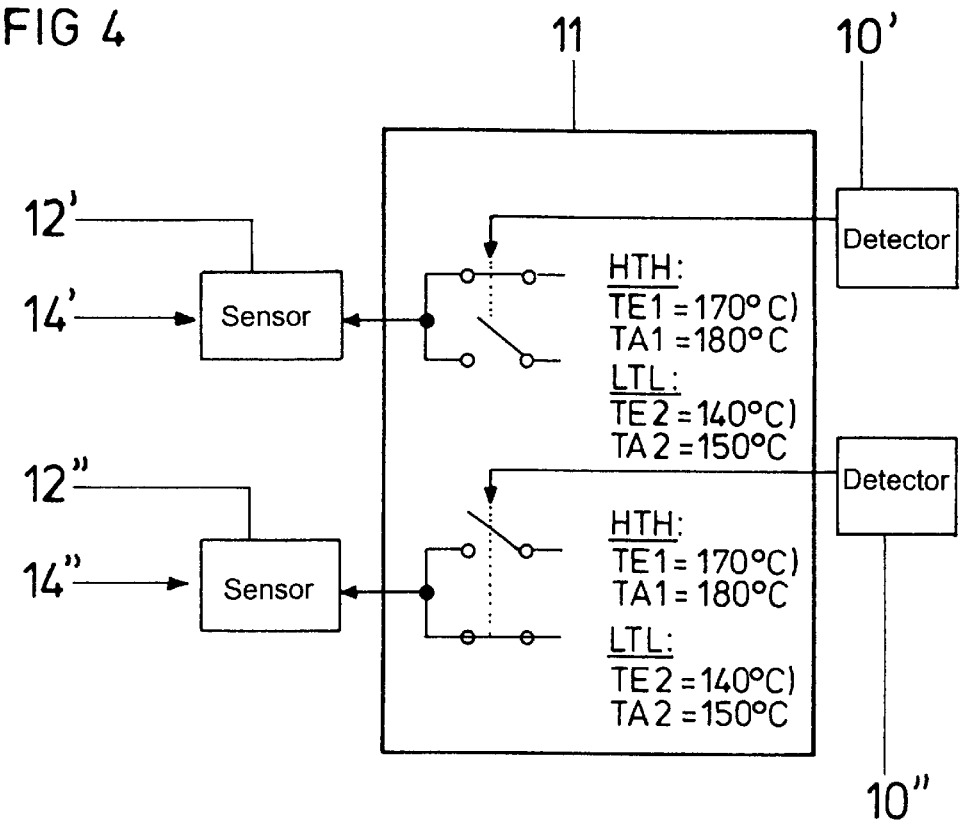
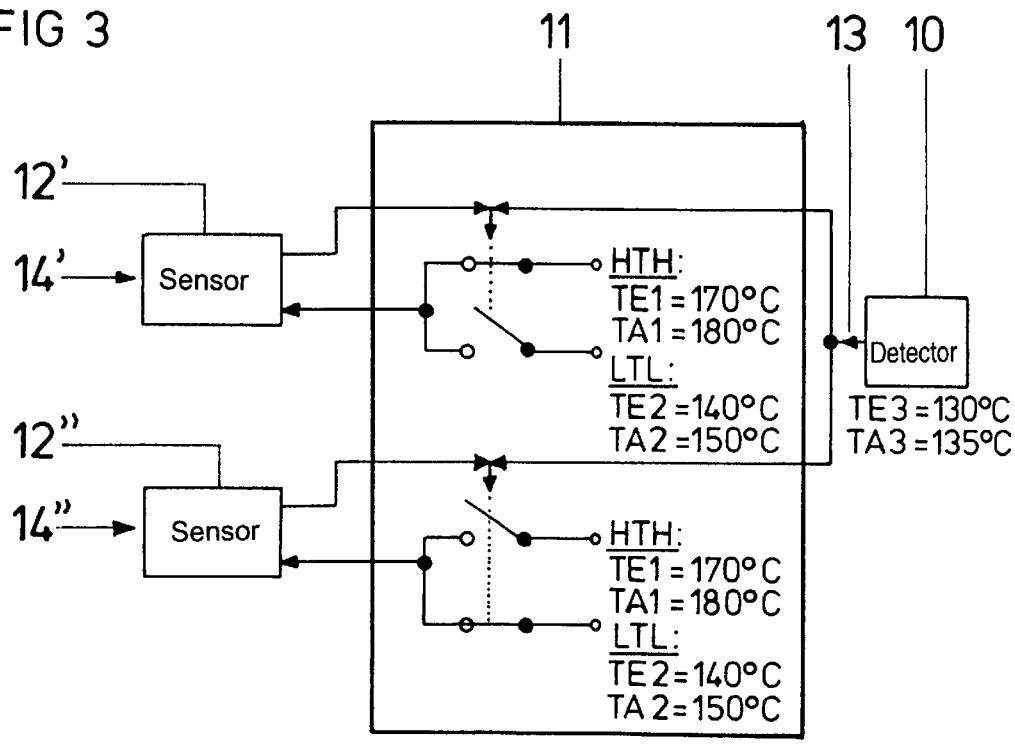

CIRCUIT CONFIGURATION WITH
TEMPERATURE PROTECTION AND
METHOD FOR IMPLEMENTING THE
TEMPERATURE PROTECTION

BACKGROUND OF THE INVENTION

FIELD OF THE INVENTION

The invention relates to a configuration and a method for protecting an integrated circuit against over-temperature conditions. Furthermore, the invention relates to an integrated circuit having such a configuration.

During the operation of integrated semiconductor circuits, at least part of the electrical power is converted into heat. Under certain conditions—for example in the event of overload, short circuit, external heating of the semiconductor chip—this can lead to an undesirable over-temperature condition. In order to detect the over-temperature condition and in order to protect the integrated semiconductor circuits, the latter typically have a temperature protection device. However, the latter must satisfy various requirements.

In circuit configurations having a power switch which is configured for switching loads, such as, for example, a DC motor, an asynchronous motor or the like, a short circuit can occur in the load circuit, through which the power switch or even the load to be switched can be destroyed. In order to protect the power switch, the latter is provided with one or more temperature sensors whose signals are evaluated by an evaluation circuit and which shut down the power switch when a short circuit occurs which results in a great increase in temperature in the power switch. When a predetermined temperature threshold is exceeded, the power switch is shut down and thus protected from destruction. In this case, the temperature sensors, which are typically configured as resistors, diodes or transistor sensors, are preferably integrated in the vicinity of the corresponding hot spot, that is to say in the vicinity of the hottest point in the power switch. The signal of the temperature sensor is then processed by an evaluation circuit in such a way that the power switch is shut down or at the very least power is reduced as soon as the temperature present at the temperature sensor exceeds a predetermined temperature threshold, which is dependent on the respective application and which typically lies above 150° C.

Furthermore, temperature sensors are known which are intended to protect the entire integrated circuit from being heated to an excessively great extent. By way of example, the integrated circuit may be heated by an external temperature source, such as, for example, an incandescent lamp driven by the integrated circuit. If the temperature coupled in via the incandescent lamp becomes too high, this can lead to irreversible damage to the integrated circuit, as a result of which the functionality thereof is no longer ensured or it is even destroyed. This applies not only to external heating but also to undesirably great inherent heating. For this purpose, temperature sensors exist which monitor the ambient temperature of the integrated circuit and are preferably disposed in the vicinity of the corresponding hot spot of the integrated circuit. In this case, the so-called "shutdown/restart" principle is typically used, according to which the integrated circuit is shut down if the chip temperature detected by a corresponding temperature sensor exceeds a specific value. Once the semiconductor chip has cooled down, for example by 10° C., the integrated circuit is switched on again. In the event of a disturbance situation, that is to say if the cause of the over-temperature condition has not been eliminated, the integrated circuit is clocked in accordance with the hysteresis resulting from the shutdown and restart temperature. The constant switching on and off in the case of a disturbance represents a major burden on the integrated circuit which in the medium term—if the disturbance is not rectified—will lead undesirably to the failure of the integrated circuit.

In circuit configurations that have a plurality of circuit parts that function independently of one another, as is the case for example with monolithic multi-channel switches, the latter are in each case provided with separate temperature sensors. In the disturbance situation, typically only the defective channel is switched on and off. However, the burden associated with the switching on and off also places a very large burden on the corresponding adjacent channels.

Therefore, two different, partly conflicting requirements result for a temperature sensor. On the one hand, a temperature sensor should have a relatively low threshold for a temperature shutdown, in order that the entire semiconductor chip or the integrated circuit, the housing and further external components are thermally loaded as little as possible in the case of a disturbance. On the other hand, a temperature sensor should have a relatively high threshold for the temperature shutdown in order nevertheless to be functional under certain conditions, for example when an incandescent lamp is switched on or in the event of a momentary, yet not disturbing overload.

The prior art has only disclosed temperature sensors in which the threshold at which a temperature-dictated shutdown of the power switch or of the integrated circuit is affected is adapted in one direction or the other, but does not simultaneously satisfy all the requirements mentioned above.

SUMMARY OF THE INVENTION

It is accordingly an object of the invention to provide a circuit configuration with temperature protection and a method for implementing the temperature protection which overcome the above-mentioned disadvantages of the prior art devices and methods of this general type, which is better adapted to the respective requirements, and furthermore, the least possible mutual thermal influencing of the individual circuit parts should be possible in so-called multi-channel ICs.

With the foregoing and other objects in view there is provided, in accordance with the invention, a configuration for protecting an integrated circuit against over-temperature conditions. The configuration contains at least one detector device for identifying a disturbance situation regarding the integrated circuit, at least one temperature sensor for detecting a temperature of at least one part of the integrated circuit, and a logic device for ascertaining a disturbance mode derived from the disturbance situation and/or the temperature. The logic device allocates a first temperature switching stage to the temperature sensor in a normal mode and a second, lower temperature switching stage to the temperature sensor in the disturbance mode. The logic device is connected to both the temperature sensor and the detector device.

With the foregoing and other objects in view there is additionally provided, in accordance with the invention, a method for protecting an integrated circuit against over-temperature conditions. The method includes the steps of checking the integrated circuit for a disturbance situation; checking a temperature of at least one part of the integrated circuit; ascertaining an occurrence of a disturbance mode based on at least one of the disturbance situation and the temperature; and allocating a first temperature switching threshold to a temperature sensor in a normal mode and a second, lower temperature switching threshold to the temperature sensor in the disturbance mode.

With the foregoing and other objects in view there is further provided, in accordance with the invention, an integrated circuit. The integrated circuit has a first terminal for a first supply potential, a second terminal for a second supply potential, and a controllable semiconductor switch disposed between the first terminal and the second terminal. The controllable semiconductor switch has a load path and a control terminal. A load is connected in series with the load path of the controllable semiconductor switch. A drive circuit is coupled to and drives the control terminal of the controllable semiconductor switch. A configuration for protection against over-temperature conditions as described above is provided.

The temperature sensor according to the invention is distinguished by an over-temperature protection configuration configured in at least two stages. The circuit parts that are operated in the normal mode and have relatively high temperature values on account of a momentary overload or a momentary short circuit are allocated a first temperature switching stage. Circuit parts which exhibit a disturbance situation and which, because of this, are heated up or heat up the entire semiconductor chip to an excessively great extent are allocated a second temperature switching stage, which is lower than the first temperature switching stage. A determining factor for the temperature-dictated shutdown of the entire circuit is in each case the second, lower temperature switching stage, without however precluding a momentary occurrence of a higher temperature that in each case lies below the first temperature switching stage. As a result, the temperature protection for the entire integrated semiconductor circuit is advantageously ensured and, moreover, it is ensured that a momentary cross-talk of the temperature does not lead undesirably to the switching off of individual circuit parts or of the entire circuit configuration.

The two temperature switching stages can advantageously be optimally adapted to the respective requirements, with the result that, in contrast to known temperature sensors, these do not have to be optimized in one direction or the other.

Each temperature stage advantageously has a shutdown value and a restart value, which can thus both operate according to the shutdown/restart principle.

Furthermore, the temperature sensor according to the invention with a temperature switching stage configured in two stages also prevents the thermal cross-talk in multi-channel circuits, since a temperature threshold defined in a respectively dedicated manner can be allocated for each individual channel and thus for the corresponding circuit parts. The criteria evaluated for the changeover are typically logic signals that may be representative of the respective state of the individual circuit parts or of the entire system.

In accordance with an added feature of the invention, the first temperature switching stage and the second, lower temperature switching stage are two temperature switching thresholds configured as a switching hysteresis in which the first temperature switching stage has a first shutdown temperature threshold and a first, lower switch-on temperature threshold and in which the second, lower temperature switching stage has a second shutdown temperature threshold and a second, lower switch-on temperature threshold.

In accordance with an added feature of the invention, the at least one temperature sensor is one of a plurality of temperature sensors, and a multiplicity of channels are provided for monitoring a temperature of an identical number of channels of the integrated circuit. Each of the channels of the configuration has one of the temperature sensors, and the temperature sensor in each case supplies an analog signal as a measure of the temperature of a circuit part to be monitored.

In accordance with an additional feature of the invention, the detector device is a short-circuit identification circuit supplying a signal as a measure of the disturbance situation in a form of a short circuit in a load circuit—to be monitored—of the integrated circuit.

In accordance with another feature of the invention, the detector device has a device for identifying an overload condition, and supplies a signal as a measure of the disturbance situation that is in a form of a momentary overload—caused by a capacitive load—in a load circuit—to be monitored—of the integrated circuit.

In accordance with a further feature of the invention, the at least one detector device is one of a plurality of detector devices each functioning as a short-circuit identification circuit, and each of the channels of the configuration has one of the detector devices.

In accordance with a further added feature of the invention, the at least one detector device is one of a plurality of detector devices each functioning as a device for identifying an overload condition, and each of the channels of the configuration has one of the detector devices.

In accordance with a further additional feature of the invention, the detector devices also function as devices for identifying an overload condition and/or as a short-circuit identification circuits.

In accordance with another further feature of the invention, the detector device has a further temperature sensor for monitoring a temperature of at least one of the integrated circuit entirely and an ambient temperature around the integrated circuit.

In accordance with a concomitant feature of the invention, the further temperature sensor is to be disposed on a lead frame and supplies a signal as a measure of the disturbance situation, the signal being dependent on a lead frame temperature.

Other features which are considered as characteristic for the invention are set forth in the appended claims.

Although the invention is illustrated and described herein as embodied in a circuit configuration with temperature protection and a method for implementing the temperature protection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a block diagram of a second exemplary embodiment of the configuration with over-temperature protection; and FIG. 4 is a block diagram of a third exemplary embodiment of the configuration with over-temperature protection.

DESCRIPTION OF THE PREFERRED EMBODIMENTS

Figure 1:
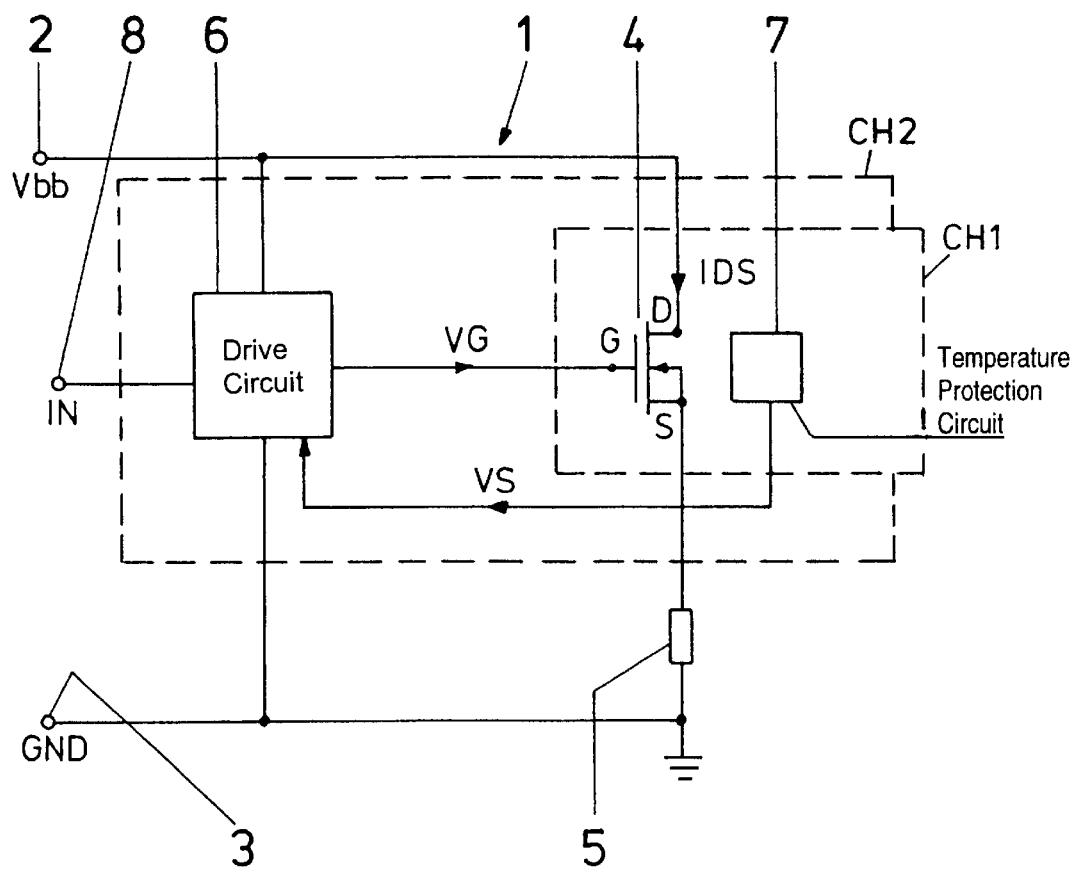
FIG. 1 is a block diagram of a basic circuit configuration with over-temperature protection according to the invention.

In the figures of the drawing, identical or functionally identical elements and signals are provided with identical reference symbols, unless specified otherwise. Referring now to the figures of the drawing in detail and first, particularly, to FIG. 1 thereof, there is shown a circuit configuration which has a configuration for protecting the circuit configuration against high temperatures. In FIG. 1, the circuit configuration to be protected is designated by 1. The circuit configuration 1 has two input terminals 2, 3, to which a positive and a negative supply potential Vbb, GND, respectively, are applied and via which the circuit configuration 1 can be supplied with energy. In the present exemplary embodiment, the first input terminal 2 has a positive supply potential Vbb, while the second input terminal 3 is at the potential of a reference ground GND.

The circuit configuration 1 has a power switch 4, which is embodied as a MOSFET in the case shown. The MOSFET 4 has a gate electrode G and also a drain electrode D and a source electrode S. The drain electrode D of the power switch 4 is connected to the first input terminal 2. Between the source electrode S and the second input terminal 3, a load 5 is disposed in series with the load path of the power switch 4, so that the power switch 4 is thus a high-side switch. However, the invention shall not be restricted exclusively to high-side switches, but rather can also be extended, within the scope of the invention, to low-side switches, half-bridge circuits, bridge circuits or other integrated circuits. The power switch 4 serves for applying a current to the load 5. The load 5 may be, for example, a DC motor, an asynchronous motor, a lamp or an integrated circuit.

Furthermore, provision is made of a drive circuit 6—connected to the two input terminals 2, 3—for driving the gate electrode G of the power switch 4. The drive circuit 6 typically has a charge pump via which a positive potential VG, which is greater than the positive supply potential Vbb, can be applied to the control terminal G of the power switch 4. The drive circuit 6 is connected to a further input terminal 8, via which a further input signal IN can be fed to the drive circuit 6.

The circuit configuration 1 furthermore has a protection circuit for protection against over-temperature 7, which is preferably closely thermally coupled to the power switch 4. It is advantageous for the temperature protection circuit 7 and the power switch 4 to be monolithically integrated on a single semiconductor chip CH1, but a discrete configuration would also be conceivable, of course, by the temperature protection circuit 7 being disposed on a separate semiconductor chip and the chip being applied on the semiconductor body containing the power switch 4 and, at the same time, being in good thermal coupling with the semiconductor body. It would also be conceivable for both the drive circuit 6 and the power switch 4 and the temperature protection circuit 7 to be integrated on a single semiconductor chip CH2.

On the output side, the temperature protection circuit 7 generates a control signal VS, which is coupled into the drive circuit 6, the drive circuit 6 controlling the power switch 4 into the on state or off state according to an internal control logic and according to the control signal VS.

Figure 2:
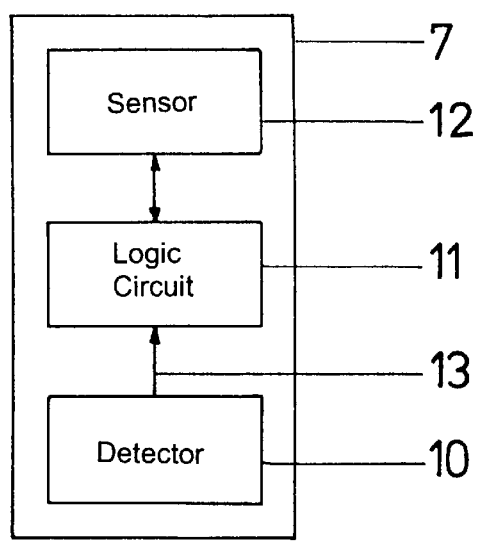
FIG. 2 is a block diagram of a first, generalized exemplary embodiment of a temperature protection circuit.

The construction and the precise method of operation of the temperature protection circuit 7 for protecting the power switch 4 or the circuit configuration 1 will be described in detail below using the exemplary embodiments of FIGS. 2 to 4. FIG. 2 shows a first, generalized exemplary embodiment of the temperature protection circuit 7 shown in FIG. 1.

The temperature protection circuit 7 has a detector device 10, a logic circuit 11 and a temperature sensor 12. The detector device 10 is configured to detect a momentary overload, a short circuit, an over temperature in the immediate vicinity of the circuit to be protected, and, on the basis thereof, to provide a status signal 13. The logic device 11, to which the status signal 13 of the detector device 10 is fed, sets the corresponding temperature switching threshold for the temperature sensor 12 disposed downstream, according to the status signal 13. The temperature sensor 12 in turn supplies an analog current that is a measure of the detected temperature. The current can be used for the purposes of the temperature-dictated shutdown. If the analog current generated by the temperature sensor 12 exceeds the temperature switching threshold, for example, then the control signal VS is conducted to the drive circuit 6, the power switch 4 being shutdown by the control signal VS.

The protection circuit 7 makes it possible, according to the invention, to provide an over temperature protection configured in two stages. The basic idea is for the temperature switching thresholds and thus the temperature protection to be realized in a gradated manner: a first, higher temperature switching stage HTL and at least one second, lower temperature switching stage LTL. In the example in FIG. 2, the higher temperature switching stage HTL is configured in the temperature range from 170° C. to 180° C. and the low temperature stage LTL is configured for the temperature range between 140° C. and 150° C., the higher temperature values of the temperature ranges just mentioned in each case designating the shutdown temperature TA1, TA2 and the lower temperature values TE1, TE2 in each case designating the restart temperature.

In the normal mode, that is to say when no disturbance situation is detected by the detector device 10, the logic device 11 switches the temperature switching stage to the high temperature stage HTL, that is to say it remains functional up to the high temperatures. In the case of a disturbance, that is detected by the detector device 10, the logic device 11 switches the switching threshold from the high temperature switching stage HTL to a low temperature switching stage LTL according to the status signal 13. Consequently, the entire circuit configuration is then subject to the lower, thermally less serious temperature switching thresholds TA2, TE2, that is to say the circuit configuration is switched on at a temperature of TE2=140° C. and switched off again at TA2=150° C. As a result of the changeover to the low temperature switching stage LTL, the circuit configuration itself or the power switch 4 is thermally burdened to a much lesser extent in disturbance situations than if they were subject to the higher temperature switching stage HTL and thus shut down and switched on again at the distinctly higher temperatures TA1 180° C. and TE1=170° C., respectively. The circuit configuration or the power switch remain functional for longer on account of this.

For the case where the disturbance is eliminated again, the logic device 11 switches again from the low temperature switching stage LTL to the high temperature switching stage HTL, so that the entire circuit configuration 1 to be protected again exhibits a lower temperature sensitivity. In this case, the circuit is now again switched off at a temperature of TA1=180° C. and switched on again at a temperature of TE1=170° C.

What is essential here is that the high temperature switching stage HTL for the normal mode is higher than the low temperature switching stage LTL for the disturbance situation. This should be understood to mean that both the switch-on and switch-off temperatures TE1, TA1 in the normal mode are in each case higher than the switch-on and switch-off temperatures TE2, TA2 in the disturbance situation.

As already mentioned, a disturbance situation triggers the changeover from the higher temperature switching stage HTL to the lower temperature switching stage LTL. A disturbance situation may be present if one or more of the now described criteria are present.

(a) A short circuit condition: The identification of a short circuit of the load current through the power switch 4 is currently included as standard for diagnosis purposes in so-called smart power ICs or so-called "intelligent" power switches.

(b) An excessively high ambient temperature condition: The evaluation of the ambient temperature of the circuit configuration to be protected may be detected for example by an external temperature sensor. The evaluation then takes place via the evaluation of the temperature signal of an additional temperature sensor which is concomitantly integrated at a colder point on the semiconductor chip and which thus represents a reference temperature for the temperature of the entire chip.

(c) An overload condition: An excessively high current momentarily flows through the load on account of a momentary overload caused by a capacitive load, for example. In a similar manner to the short-circuit identification, the overload can be identified by evaluation of the internal load current.

The invention is not only suitable for those temperature protection circuits which are in each case assigned to a single circuit part, but can be used particularly advantageously in multi-channel applications, that is to say in an integrated circuit containing a plurality of circuit parts which are each assigned a temperature protection circuit.

FIG. 3 uses a first exemplary embodiment to illustrate the principle of the application of the temperature protection circuit 7 according to the invention in a power switch configured as a two-channel high-side switch, in which the temperature of the entire chip is used as changeover criterion between HTL and LTL.

The temperature protection circuit 7 in FIG. 3 in this case serves for the temperature protection of two channels 14', 14" of a semiconductor circuit to be protected. The temperature of the two channels 14', 14" is in this case monitored by a respective temperature sensor 12', 12" assigned to a channel. Moreover, provision is made for a further temperature sensor, which is provided specially for monitoring the temperature of the entire circuit configuration and functions as a detector device 10. The temperature sensor 10 may, for example, be disposed on a lead frame and detect the temperature of the lead frame or of the atmosphere surrounding the latter. In the disturbance situation, the temperature sensor 10 supplies a signal as a measure of the disturbance situation, the signal being dependent on the lead frame temperature.

In the normal mode, as is known, the two channels 14', 14" are allocated the high temperature switching stage HTL, that is to say the temperature hysteresis 170° C.–180° C. In the present case, the first channel 14' is in the normal mode, that is to say that it has the high temperature threshold HTL, while a disturbance situation has been detected in the second channel 14" and the latter has been switched to the low temperature switching stage LTL by the logic circuit 11, so that it switches on at TE2=140° C. and shuts down at TA2=150° C. The temperature sensor 10 for the entire chip likewise has a temperature hysteresis in the case of which the semiconductor circuit is shut down at TA3=135° C. and switched on at TE3=130° C.

For the case where the temperature of the entire chip has reached a specific value, e.g. TA3=135° C., and, at the same time, one of the temperature sensors 12', 12" assigned to the channels 14', 14" has responded, e.g. at TA1=180° C., the corresponding (second) channel 14" is set to the low temperature threshold LTL. The second channel 14" is reset to the high temperature switching stage HTL again only when it has reached its restart temperature, that is to say TE2=140° C., and the entire chip has at the same time cooled down to a reset temperature of TE3=130° C.

The particular advantage of this embodiment of the temperature protection circuit 7 is that, in the case of a disturbance, only the affected channel has to be set to the comparatively low temperature switching stage LTL. The adjacent channels remain at the comparatively high, less sensitive temperature switching stage HTL, provided that the conditions for a disturbance situation are not met in the channels. As a result, in multi-channel applications, those circuit parts that are not affected by a disturbance situation but are coupled to the channel exhibiting a disturbance situation are not burdened.

FIG. 4 uses a second exemplary embodiment to illustrate the principle of the application of a temperature protection circuit according to the invention in a power switch configured as a two-channel high-side switch, in which a short circuit of the load current IDS is used as changeover criterion between HTL and LTL.

In FIG. 4 as well, the two channels 14', 14" are provided, each of the channels 14', 14" being assigned a detector device 10', 10" which is provided specially therefor and serves for identifying a short circuit of the power switches assigned to the respective channel 14', 14". As already mentioned, the circuits for short-circuit identification are concomitantly integrated as standard in power switches used nowadays and are configured to detect a short circuit of the load current IDS to ground GND. Since, in a disturbance situation, that is to say in the case of a short circuit in the load circuit of the power switch, the affected channel heats the entire chip, provision is made here for using the respective short-circuit identification as a criterion for activation of the low temperature switching stage LTL on the respectively assigned channel.

In the present case, the first channel 14' is in the normal mode, while a short circuit has been identified in the second channel 14". The logic circuit 11 thus switches the temperature switching threshold from HTL to LTL in the case of the second channel 14". If the corresponding detector device 10 identifies that the short circuit has been eliminated, the respective channel is set into the normal mode again by the logic circuit 11, that is to say the temperature switching stage of this channel 14" is reset from LTL to HTL again.

The invention shall not be restricted exclusively to one-channel or two-channel circuits, but rather can, of course, be used highly advantageously in all multi-channel circuit configurations. Furthermore, the invention shall not be restricted exclusively to temperature protection circuits for protecting a power switch. Rather, the gradated temperature protection is advantageous in all integrated circuits. It shall be seen that the temperature thresholds and numerical examples specified were picked out in exemplary fashion and serve for better illustrating the invention. It goes without saying that the temperature thresholds can be chosen differently as desired within the scope of the invention.

The present semiconductor circuit according to the invention has been set forth using the above description in such a way as to explain as well as possible the principle of the invention and its practical application. It goes without saying that the invention can be modified in manifold ways within the scope of expert action without this involving an inventive step.

We claim:

1. A configuration for protecting an integrated circuit against over-temperature conditions, the configuration comprising:
   at least one detector device for identifying a disturbance situation regarding the integrated circuit;
   at least one temperature sensor for detecting a temperature of at least one part of the integrated circuit; and
   a logic device for ascertaining a disturbance mode derived from at least one of the disturbance situation and the temperature, said logic device allocating a first temperature switching stage to said temperature sensor in a normal mode and a second, lower temperature switching stage to said temperature sensor in the disturbance mode, said logic device connected to both said temperature sensor and said detector device.

2. The configuration according to claim 1, wherein the first temperature switching stage and the second, lower temperature switching stage are two temperature switching thresholds configured as a switching hysteresis in which the first temperature switching stage has a first shutdown temperature threshold and a first, lower switch-on temperature threshold and in which the second, lower temperature switching stage has a second shutdown temperature threshold and a second, lower switch-on temperature threshold.

3. The configuration according to claim 1,
   wherein said at least one temperature sensor is one of a plurality of temperature sensors; and
   including a multiplicity of channels for monitoring a temperature of an identical number of channels of the integrated circuit, each of said channels of the configuration having said at least one of said temperature sensors, and said temperature sensor in each case supplies an analog signal as a measure of the temperature of a circuit part to be monitored.

4. The configuration according to claim 1, wherein said detector device is a short-circuit identification circuit supplying a signal as a measure of the disturbance situation in a form of a short circuit in a load circuit—to be monitored—of the integrated circuit.

5. The configuration according to claim 1, wherein said detector device has a device for identifying an overload condition, and supplies a signal as a measure of the disturbance situation which is in a form of a momentary overload—caused by a capacitive load—in a load circuit to be monitored—of the integrated circuit.

6. The configuration according to claim 3, wherein said at least one detector device is one of a plurality of detector devices each functioning as a short-circuit identification circuit, and each of said channels of the configuration has one of said detector devices.

7. The configuration according to claim 3, wherein said at least one detector device is one of a plurality of detector devices each functioning as a device for identifying an overload condition, and each of said channels of the configuration has one of said detector devices.

8. The configuration according to claim 6, wherein said detector devices a lso function as devices for identifying an overload condition.

9. The configuration according to claim 7, wherein each of said detector devices also function as a short-circuit identification circuit.

10. The configuration according to claim 1, wherein said detector device has a further temperature sensor for monitoring a temperature of at least one of the integrated circuit entirely and an ambient temperature around the integrated circuit.

11. The configuration according to claim 10, wherein said further temperature sensor is to be disposed on a lead frame and supplies a signal as a measure of the disturbance situation, the signal being dependent on a lead frame temperature.

12. A method for protecting an integrated circuit against over-temperature conditions, which comprises the steps of:
    checking the integrated circuit for a disturbance situation;
    checking a temperature of at least one part of the integrated circuit;
    ascertaining an occurrence of a disturbance mode based on at least one of the disturbance situation and the temperature; and
    allocating a first temperature switching threshold to a temperature sensor in a normal mode and a second, lower temperature switching threshold to the temperature sensor in the disturbance mode.

13. The method according to claim 12, which comprises setting the first temperature switching threshold and the second, lower temperature switching threshold as two temperature switching thresholds configured as a switching hysteresis in which the first temperature switching threshold has a first shutdown temperature threshold and a first, lower switch-on temperature threshold and the second, lower temperature switching threshold has a second shutdown temperature threshold and a second, lower switch-on temperature threshold.

14. The method according to claim 12, which comprises:
    providing the temperature sensor as one of a plurality of temperature sensors; and
    providing a multiplicity of channels for monitoring a temperature of an identical number of integrated circuit channels of the integrated circuit, each of the channels having one of the temperature sensors, and the temperature sensor in each case supplies an analog signal as a measure of the temperature of a circuit part to be monitored.

15. The method according to claim 12, which comprises providing a detector device as a short-circuit identification circuit supplying a signal as a measure of the disturbance situation in a form of a short circuit in a load circuit—to be monitored—of the integrated circuit.

16. The method according to claim 12, which comprises providing a detector device with a device for identifying an overload condition, and the device supplies a signal as a measure of the disturbance situation which is in a form of a momentary overload—caused by a capacitive load—in a load circuit—to be monitored—of the integrated circuit.

17. The method according to claim 14, which comprises providing a plurality of detector devices each functioning as a short-circuit identification circuit, and each of the channels has one of the detector devices.

18. The method according to claim 14, which comprises providing a plurality of detector devices each functioning as a device for identifying an overload condition, and each of the channels has one of the detector devices.

19. The method according to claim 17, which comprises forming the detector devices to also function as devices for identifying an overload condition.

20. The method according to claim 18, which comprises forming each of the detector devices to also function as a short-circuit identification circuit.

21. The method according to claim 12, which comprises providing a detector device having a further temperature sensor for monitoring a temperature of at least one of the integrated circuit entirely and an ambient temperature around the integrated circuit.

22. The method according to claim 21, which comprises disposing the further temperature sensor on a lead frame and the further temperature sensor supplies a signal as a measure of the disturbance situation, the signal being dependent on a temperature of the lead frame.

23. An integrated circuit, comprising:
- a first terminal for a first supply potential;
- a second terminal for a second supply potential;
- a controllable semiconductor switch disposed between said first terminal and said second terminal, said controllable semiconductor switch having a load path and a control terminal;
- a load connected in series with said load path of said controllable semiconductor switch;
- a drive circuit coupled to and driving said control terminal of said controllable semiconductor switch; and
- a configuration for protection against over-temperature conditions, said configuration including:
  - at least one detector device for identifying a disturbance situation regarding the integrated circuit;
  - at least one temperature sensor for detecting a temperature of at least one part of the integrated circuit; and
  - a logic device for ascertaining a disturbance mode derived from at least one of the disturbance situation and the temperature, said logic device allocates a first temperature switching stage to said temperature sensor in a normal mode and allocates a second, lower temperature switching stage to said temperature sensor in the disturbance mode, said logic device connected to both said temperature sensor and said detector device.

24. The integrated circuit according to claim 23, wherein said controllable semiconductor switch, said drive circuit and said configuration are monolithically integrated on a single semiconductor chip.

25. The integrated circuit according to claim 23, wherein said controllable semiconductor switch and said configuration are monolithically integrated on a single semiconductor chip.

* * * * *